(12) United States Patent
Nishikawa et al.

(10) Patent No.: US 10,748,926 B2
(45) Date of Patent: Aug. 18, 2020

(54) SEMICONDUCTOR MEMORY DEVICE

(71) Applicant: Toshiba Memory Corporation, Minato-ku (JP)

(72) Inventors: Kota Nishikawa, Kawasaki (JP); Hiroshi Tsubouchi, Yokohama (JP); Kenri Nakai, Fujisawa (JP)

(73) Assignee: Toshiba Memory Corporation, Minato-ku (JP)

( * ) Notice: Subject to any disclaimer, the term of this patent is extended or adjusted under 35 U.S.C. 154(b) by 0 days.

(21) Appl. No.: 16/299,416

(22) Filed: Mar. 12, 2019

(65) Prior Publication Data

US 2020/0006379 A1 Jan. 2, 2020

(30) Foreign Application Priority Data

Jun. 29, 2018 (JP) ................. 2018-125194

(51) Int. Cl.
*G11C 16/10* (2006.01)
*H01L 27/11582* (2017.01)
*H01L 23/528* (2006.01)
*G11C 16/08* (2006.01)
*H01L 27/1157* (2017.01)
(Continued)

(52) U.S. Cl.
CPC .... *H01L 27/11582* (2013.01); *G11C 11/5671* (2013.01); *G11C 16/0483* (2013.01); *G11C 16/08* (2013.01); *G11C 16/10* (2013.01); *G11C 16/14* (2013.01); *G11C 16/24* (2013.01); *G11C 16/26* (2013.01); *H01L 23/528* (2013.01); *H01L 27/1157* (2013.01); *H01L 27/11573* (2013.01); *H01L 29/1037* (2013.01)

(58) Field of Classification Search
CPC ............. H01L 45/1233; H01L 45/1246; H01L 45/147; H01L 45/1266; H01L 45/1608; G11C 13/007; G11C 13/004; G11C 13/0069
USPC ........................................................ 365/148
See application file for complete search history.

(56) References Cited

U.S. PATENT DOCUMENTS

| 7,952,931 B2 * | 5/2011 | Nagashima ........ G11C 16/0483 365/185.18 |
| 7,969,789 B2 | 6/2011 | Katsumata et al. |

(Continued)

FOREIGN PATENT DOCUMENTS

| JP | 2008-300019 | 12/2008 |
| JP | 5086933 | 11/2012 |

(Continued)

*Primary Examiner* — Xiaochun L Chen
(74) *Attorney, Agent, or Firm* — Oblon, McClelland, Maier & Neustadt, L.L.P.

(57) ABSTRACT

According to one embodiment, a semiconductor memory device includes the following configuration. A second word line is provided above a first word line on a substrate. A third word line is provided above the second word line. A semiconductor layer includes a first part that passes through the first word line, a second part that passes through the second and the third word lines, and is provided above the first part, and a joint provided between the first and second parts. When a write operation is performed on a memory cell of the third word line, prior to applying a write voltage to the third word line, a first voltage is applied to a bit line, a second voltage is applied to the third word line, and a third voltage higher than the second voltage is applied to the second word line.

19 Claims, 9 Drawing Sheets

(51) Int. Cl.
*G11C 16/14* (2006.01)
*G11C 16/04* (2006.01)
*G11C 16/26* (2006.01)
*H01L 27/11573* (2017.01)
*H01L 29/10* (2006.01)
*G11C 11/56* (2006.01)
*G11C 16/24* (2006.01)

(56) References Cited

U.S. PATENT DOCUMENTS

| | | | |
|---|---|---|---|
| 7,983,084 B2 | 7/2011 | Tokiwa et al. | |
| 8,902,651 B2 * | 12/2014 | Kwak | H01L 27/1157 |
| | | | 365/185.03 |
| 9,412,456 B2 * | 8/2016 | Kwak | H01L 27/1157 |
| 9,589,660 B1 | 3/2017 | Hashimoto et al. | |
| 9,672,926 B2 | 6/2017 | Shiino et al. | |
| 2009/0267128 A1 | 10/2009 | Maejima | |
| 2009/0268522 A1 | 10/2009 | Maejima | |
| 2010/0207195 A1 | 8/2010 | Fukuzumi et al. | |
| 2011/0284946 A1 | 11/2011 | Kiyotoshi | |
| 2013/0094294 A1 * | 4/2013 | Kwak | H01L 27/1157 |
| | | | 365/185.03 |

FOREIGN PATENT DOCUMENTS

| | | |
|---|---|---|
| JP | 5193796 | 5/2013 |
| JP | 2014-225310 | 12/2014 |
| JP | 6400547 | 10/2018 |

\* cited by examiner

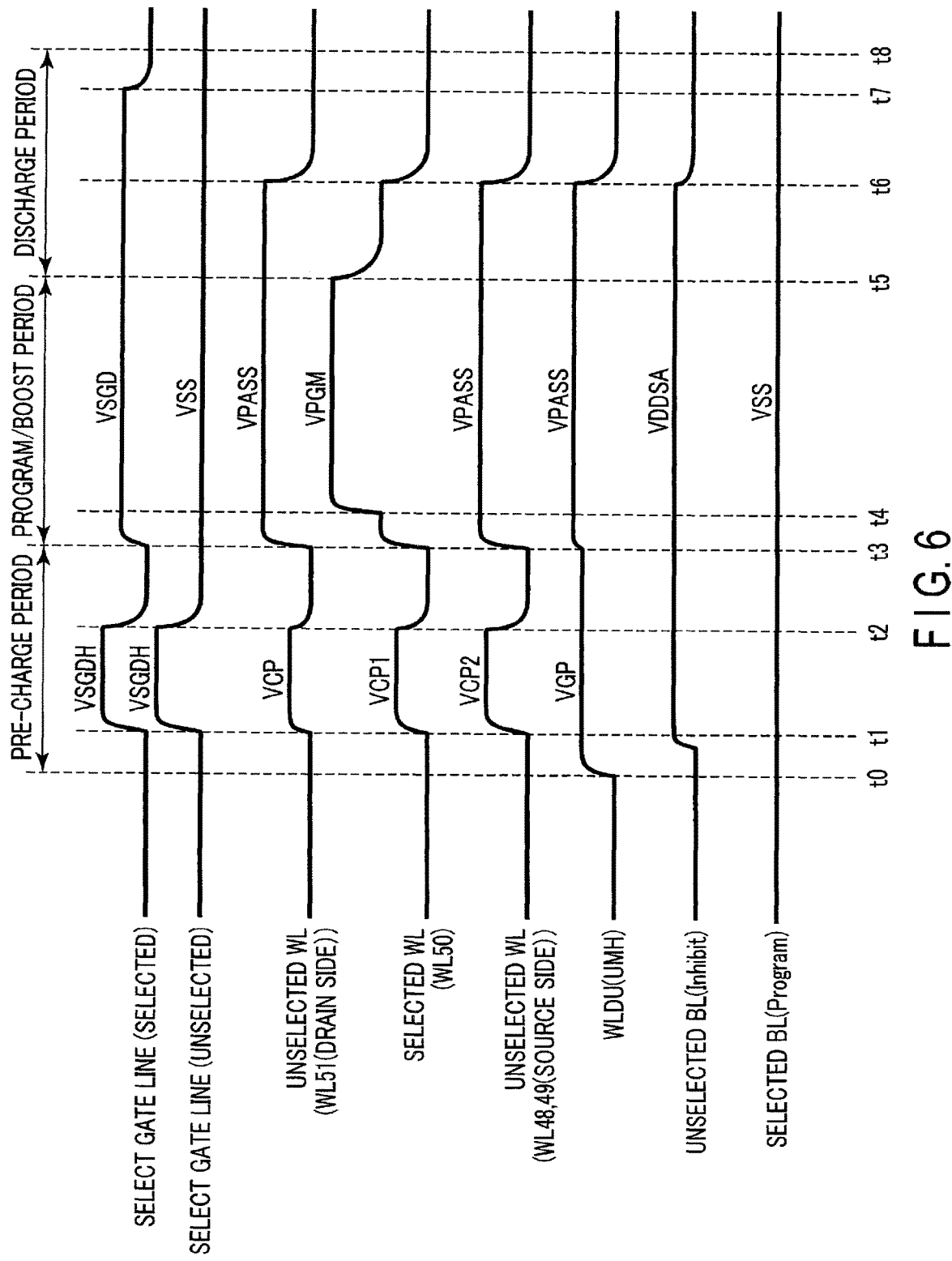
F I G. 6

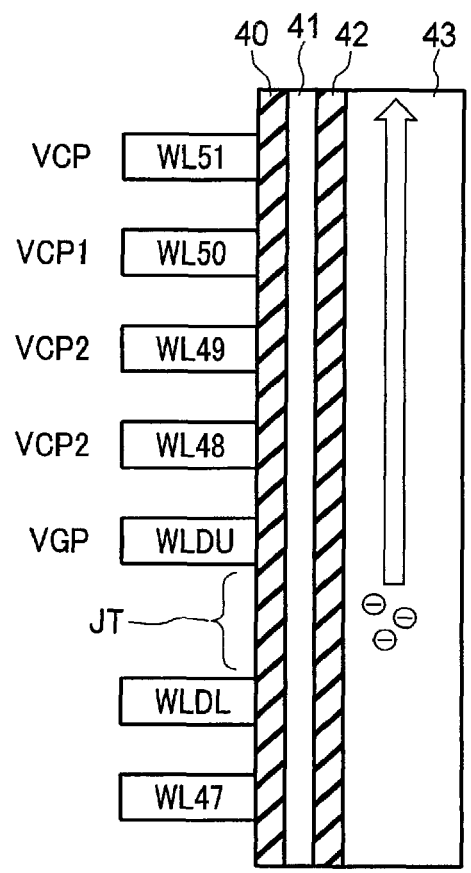
F I G. 9

SEMICONDUCTOR MEMORY DEVICE

CROSS-REFERENCE TO RELATED APPLICATIONS

This application is based upon and claims the benefit of priority from the Japanese Patent Application No. 2018-125194, filed Jun. 29, 2018, the entire contents of which are incorporated herein by reference.

FIELD

Embodiments described herein relate generally to a semiconductor memory device.

BACKGROUND

A semiconductor memory in which memory cells are three-dimensionally arranged is known.

BRIEF DESCRIPTION OF THE DRAWINGS

FIG. 6 is a timing chart of a program operation in a first example of a write operation of the embodiment.

FIG. 9 is a schematic diagram showing behavior of electrons trapped in a joint according to the embodiment.

DETAILED DESCRIPTION

In general, according to one embodiment, a semiconductor memory device includes a first word line, a second word line, a third word line, a first semiconductor layer, a first bit line and a row decoder. The first word line is provided above a substrate. The second word line is provided above the first word line. The third word line is provided above the second word line. The first semiconductor layer includes a first part that passes through the first word line, and is provided above the substrate, a second part that passes through the second and the third word lines, and is provided above the first part, and a first joint that is provided between the first part and the second part. The first bit line is electrically connected to the first semiconductor layer. The row decoder applies a voltage to the first, the second, and the third word lines. When a write operation is performed on a memory cell transistor connected to the third word line, prior to applying a write voltage to the third word line, a first voltage is applied to the first bit line, a second voltage is applied to the third word line, and a third voltage that is higher than the second voltage is applied to the second word line.

In the following explanation of an embodiment, constituent elements having the same functions and configurations will be denoted by the same reference symbols. Each of the embodiments described below merely indicates an exemplary apparatus or a method for implementing the technical idea of the embodiment; therefore, does not limit the element materials, shapes, structures, and arrangements, etc. to the ones described below.

Each of the function blocks can be implemented in the form of hardware, computer software, or a combination thereof. It is not essential for the function blocks to be categorized as in the example described below. For example, some functions may be implemented by a function block other than the exemplary function blocks. In addition, the exemplary function blocks may be further divided into detailed function sub-blocks. Here, a semiconductor memory device will be described with reference to an example of a three-dimensionally stacked NAND flash memory, in which a memory cell transistor is stacked above a semiconductor substrate.

EMBODIMENTS

A semiconductor memory device according to an embodiment will be explained.

1. Configuration of Semiconductor Memory Device

Figure 1:
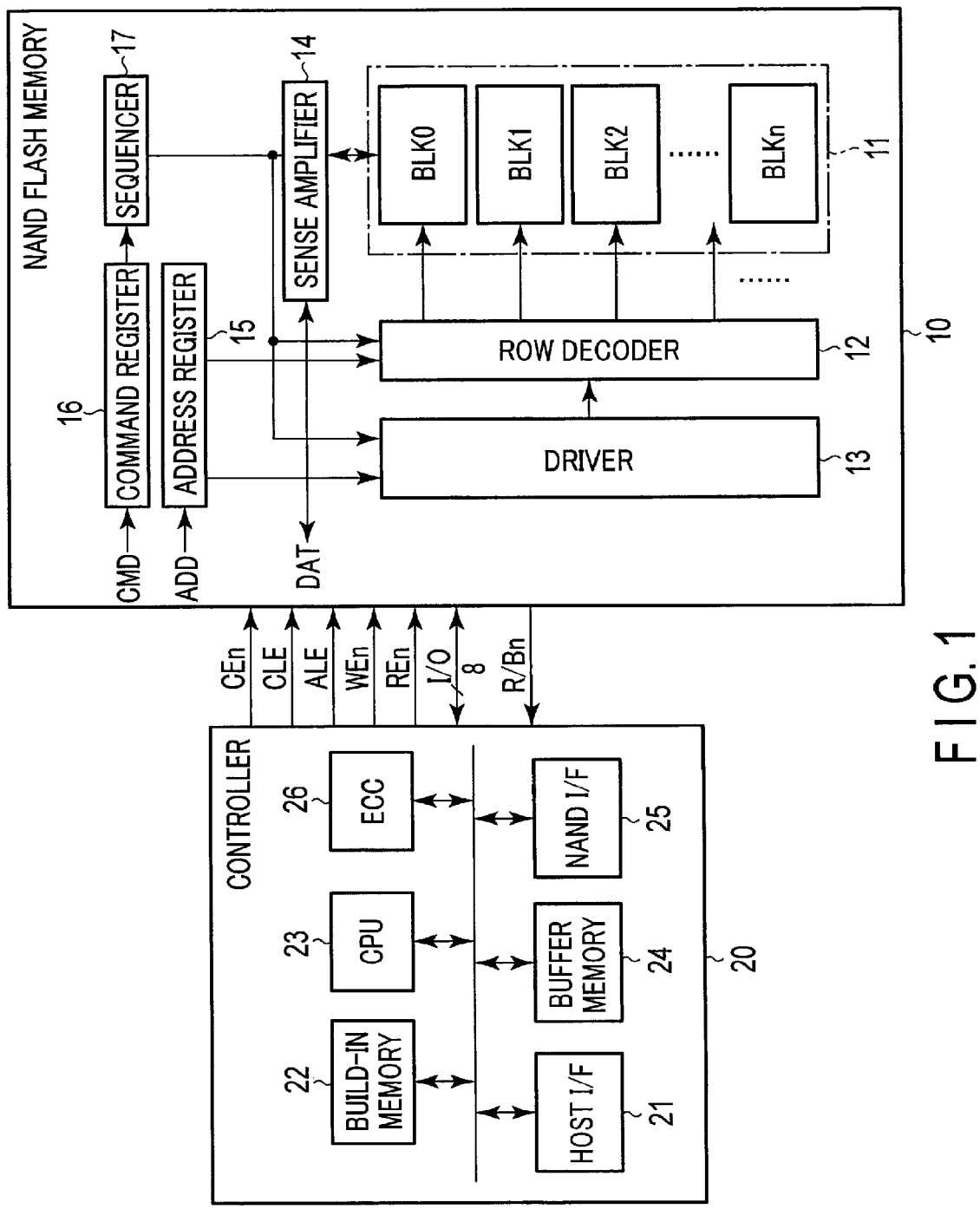
FIG. 1 is a block diagram showing a configuration of a semiconductor memory device of an embodiment.

A configuration of a semiconductor memory device of the present embodiment will be explained with reference to FIG. 1. FIG. 1 is a block diagram showing a configuration of a semiconductor memory device of an embodiment.

A NAND-type flash memory 10 serving as the semiconductor memory device is a memory storing data in a non-volatile manner, and includes a plurality of memory cells. As shown in FIG. 1, the NAND-type flash memory 10 includes a memory cell array 11, a row decoder 12, a driver 13, a sense amplifier 14, an address register 15, a command register 16, and a sequencer 17. For example, the NAND-type flash memory 10 is connected to a controller 20 via an external NAND bus. The controller 20 accesses the NAND-type flash memory 10 and controls the NAND-type flash memory 10. Details of the NAND bus and the controller 20 will be explained later on.

The memory cell array 11 includes a plurality of blocks BLK0, BLK1, BLK2, . . . , BLKn (n is an integer equal to or greater than 0) including a plurality of non-volatile memory cells that are corresponded to a row and a column. Hereinafter, the description "block BLK" will indicate each of the blocks BLK0 to BLKn. The memory cell array 11 stores data provided from the controller 20. Details of the memory cell array 11 and the block BLK will be explained later on.

The row decoder 12 selects one of the blocks BLK, and further selects a word line in the selected block BLK. Details of the row decoder 12 will be explained later on.

The driver 13 supplies a voltage to the selected block BLK via the row decoder 12.

When reading data, the sense amplifier 14 senses data DAT read from the memory cell array 11, and performs necessary computations. The data DAT is then output to the controller 20. When writing data, the sense amplifier 14 transfers write data DAT received from the controller 20 to the memory cell array 11.

The address register 15 holds an address ADD received from the controller 20. The address ADD includes a block address designating a block BLK of an operation target, and a page address designating a word line of an operation target in the designated block. The command register 16 holds a command CMD received from the controller 20. The command CMD includes, for example, a write command that commands the sequencer 17 to perform a write operation, and a read command that commands the sequencer 17 to perform a read operation.

The sequencer 17 controls the operation of the NAND-type flash memory 10 based on the command CMD held in the command register 16. Specifically, based on the write command held in the command register 16, the sequencer 17 controls the row decoder 12, the driver 13, and the sense amplifier 14, and performs writing to a plurality of memory cell transistors designated by the address ADD. Based on the read command held in the command register 16, the sequencer 17 also controls the row decoder 12, the driver 13, and the sense amplifier 14, and performs reading from a plurality of memory cell transistors designated by the address ADD.

As mentioned above, the NAND-type flash memory 10 is connected to the controller 20 via the NAND bus. The NAND bus transmits and receives a signal in accordance with an NAND interface. Specifically, the NAND bus includes a bus that communicates, for example, a chip enable signal CEn, a command latch enable signal CLE, an address latch enable signal ALE, a write enable signal WEn, a read enable signal REn, an input-output signal I/O, and a ready/busy signal R/Bn. The input-output signal I/O is transmitted with an 8-bit bus width. The input-output signal I/O communicates the command CMD, the address ADD, and the data DAT, etc.

The configuration of the controller 20 will be explained with reference to FIG. 1. The controller 20 includes a host interface (I/F) circuit 21, a built-in memory 22, a processor (CPU) 23, a buffer memory 24, a NAND interface (I/F) circuit 25, and an Error Checking and Correcting (ECC) circuit 26.

The host interface circuit 21 is connected to a host device (not shown) via a host bus. The host interface circuit 21 transfers commands and data received from the host device to the processor 23 and the buffer memory 24, respectively. The host interface circuit 21 also transfers data in the buffer memory 24 to the host device in response to a command from the processor 23.

The processor 23 controls the entire operation of the controller 20. For example, when having received a write command from the host device, the processor 23 issues a write command to the NAND interface circuit 25 in response thereto. The same applies upon reading and erasing. The processor 23 executes various kinds of processing, such as wear leveling, in order to manage the NAND-type flash memory 10. The operation of the controller 20 explained below may be realized by executing software (or firmware) by the processor 23, or by hardware.

The NAND interface circuit 25 is connected to the NAND-type flash memory 10 via the NAND bus, and controls communication with the NAND-type flash memory 10. Based on a command received from the processor 23, the NAND interface circuit 25 transmits various kinds of signals to the NAND-type flash memory 10, and receives various kinds of signals from the NAND-type flash memory 10.

The buffer memory 24 temporarily holds read data and write data. The buffer memory 24 may be configured by a DRAM or an SRAM, etc.

The built-in memory 22 is a semiconductor memory, such as a DRAM or an SRAM, and is used as an operation area of the processor 23. The built-in memory 22 holds firmware and various management tables, etc., for managing the NAND flash memory 10.

The ECC circuit 26 performs error detection and error correction processing regarding data stored in the NAND type flash memory 10. In other words, the ECC circuit 26 generates an error correcting code and gives the code to the write data when writing data, and decodes the code when reading data.

1.1. Configuration of Memory Cell Array 11

1.1.1. Circuit Configuration of Block BLK

Figure 2:
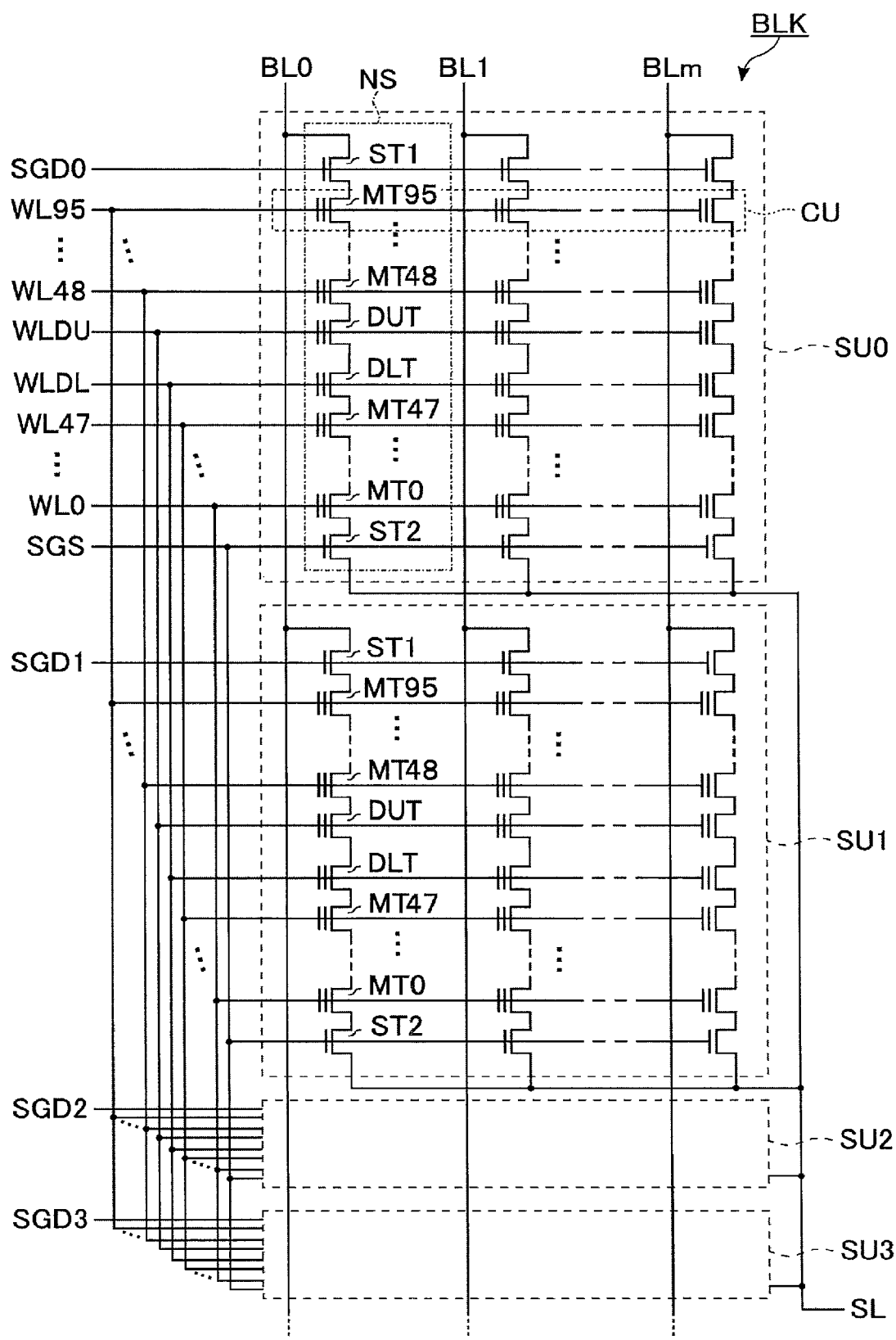
FIG. 2 is a circuit diagram of a block in a memory cell array according to the embodiment.

The circuit configuration of the block BLK included in the memory cell array 11 will be explained with reference to FIG. 2. FIG. 2 is a circuit diagram of the block BLK in the memory cell array 11. As shown in FIG. 2, the block BLK includes, for example, four string units, SU0, SU1, SU2, and SU3. Hereinafter, the description "string unit SU" will indicate each of the string units SU0 to SU3.

Each of the string units SU includes a plurality of NAND strings NS. The NAND strings NS are associated respectively with bit lines BL0, BL1, . . . , and BLm (m is an integer not less than 0). Hereinafter, the description "bit line BL" will indicate each of the bit lines BL0 to BLm. Each of the NAND strings NS includes, for example, memory cell transistors MT0, MT1, MT2, . . . , and MT47, dummy transistors DLT and DUT, memory cell transistors MT48, MT49, MT50, . . . , and MT95, and select gate transistors ST1 and ST2. Hereinafter, the description "memory cell transistor MT" will indicate each of the memory cell transistors MT0 to MT95.

The memory cell transistor MT includes a control gate and a charge storage layer, and stores data in a nonvolatile manner. Each of the dummy transistors DLT and DUT is, for example, configured in the same manner as the memory cell transistor MT, and is a memory cell transistor that is not used for storing data. Each of the select gate transistors ST1 and ST2 is used to select a string unit SU when performing various types of operation.

At each of the NAND strings NS, a drain of the select gate transistor ST1 is connected to a corresponding bit line BL. The memory cell transistors MT48 to MT95 are connected in series between a source of the select gate transistor ST1 and a drain of the dummy transistor DUT. A source of the dummy transistor DUT is connected to a drain of the dummy transistor DLT. The memory cell transistors MT0 to MT47 are connected in series between a source of the dummy transistor DLT and a drain of the select gate transistor ST2.

In the same block BLK, each of the control gates of the memory cell transistors MT0 to MT95 is commonly connected to the word lines WL0 to WL95, respectively. The control gates of the dummy transistors DUT are commonly connected to a dummy word line WLDU. The control gates of the dummy transistors DLT are commonly connected to a dummy word line WLDL. The gate of the select gate transistor ST1 included in each of the string units SU0 to SU3 is commonly connected to select gate lines SGD0 to SGD3, respectively. The gates of the select gate transistors ST2 are commonly connected to a select gate line SGS.

A different column address is allocated to each of the bit lines BL0 to BLm. The bit line BL is commonly connected to the select gate transistors ST1 of the corresponding NAND strings NS among the blocks BLK. The word lines WL0 to WL95 and the dummy word lines WLDU and WLDL are provided respectively for each block BLK. A source line SL is shared among the blocks BLK.

A plurality of memory cell transistors MT connected to a common word line WL within one string unit SU are referred to as a cell unit CU. A memory capacity of the cell unit CU changes in accordance with the number of bits of data stored in the memory cell transistor MT. For example, the cell units CU respectively store one-page data, two-page data, and three-page data, in the case where each memory cell transistor MT stores one-bit data, two-bit data, and three-bit data.

1.1.2. Cross-Sectional Structure of Memory Cell Array

Figure 3:
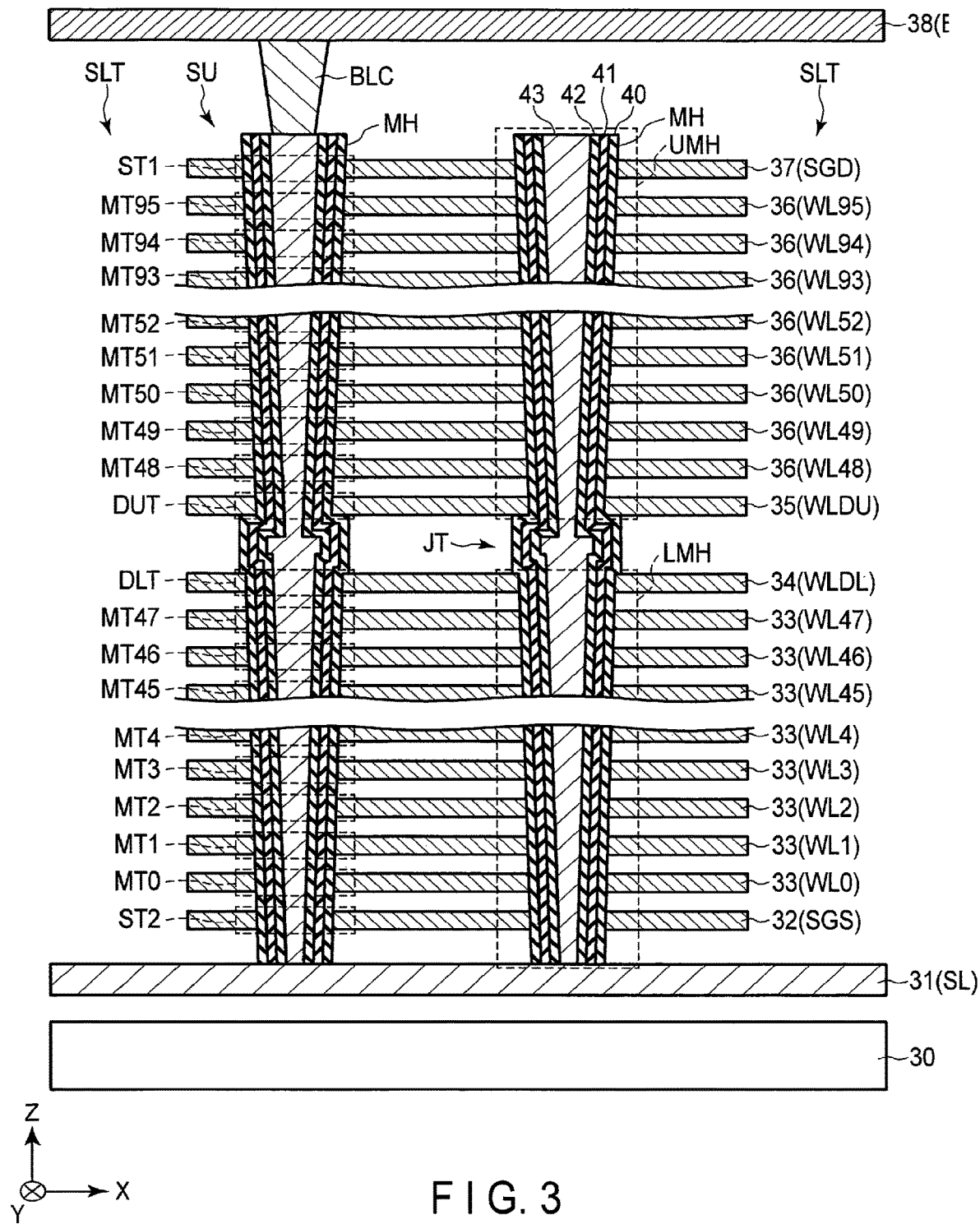
FIG. 3 is a cross-sectional view of a memory cell transistor in the memory cell array according to the embodiment.

A cross-sectional structure of the memory cell transistor in the memory cell array 11 will be explained with reference to FIG. 3. FIG. 3 is a cross-sectional view of a memory cell transistor in the memory cell array 11 according to the embodiment. Here, interlayer insulation films are omitted between conductive layers. In FIG. 3, two directions that are orthogonal to each other and are in parallel with a semiconductor substrate 30 surface will be referred to as an X-direction and a Y-direction, and a direction that is orthogonal to the X-direction and the Y-direction (an XY-plane) will be referred to as a Z-direction (stacking direction).

As shown in FIG. 3, the memory cell array 11 includes a semiconductor substrate 30, conductive layers 31 to 38, a memory pillar MH, and a contact plug BLC. A main surface of the semiconductor substrate 30 corresponds to the XY-plane. The conductive layer 31 is provided above the semiconductor substrate 30 via an insulation layer. The conductive layer 31 is formed plate-like along the XY-plane, and functions as a source line SL.

A plurality of slits SLT along a YZ-plane are arranged in the X direction on the conductive layer 31. A structure on the conductive layer 31 and between the neighboring slits SLT corresponds to, for example, one string unit SU. Specifically, on the conductive layer 31 and between the neighboring slits SLT are provided, in the order from the bottom layer, a conductive layer 32, 48 pieces of conductive layers 33, a conductive layer 34, a conductive layer 35, 48 pieces of conductive layers 36, and a conductive layer 37. Among these conductive layers, conductive layers neighboring in the Z-direction are stacked via the interlayer insulation film. Each of the conductive layers 32 to 37 is formed plate-like along the XY-plane.

The conductive layer 32 functions as the select gate line SGS. The 48 pieces of conductive layers 33 function respectively as the word lines WL0 to WL47 in the order from the bottom layer. The conductive layers 34 and 35 function respectively as the dummy word lines WLDL and WLDU. The 48 pieces of conductive layers 36 function respectively as the word lines WL48 to WL95 in the order from the bottom layer. The conductive layer 37 functions as the select gate line SGD.

A plurality of memory pillars MH are arranged, for example, stagger-like in the Y-direction (not shown), and each of the memory pillars functions as one NAND string NS. Each of the memory pillars MH is provided passing through the conductive layers 32 to 37 so as to reach an upper surface of the conductive layer 31 from an upper surface of the conductive layer 37. Each of the memory pillars MH also includes a lower pillar LMH, an upper pillar UMH, and a joint JT between the lower pillar LMH and the upper pillar UMH.

The upper pillar UMH is provided on the lower pillar LMH, and the lower pillar LMH and the upper pillar UMH are joined via the joint JT. In other words, the lower pillar LMH is provided on the conductive layer 31, and the upper pillar UMH is provided on the lower pillar LMH via the joint JT. For example, an outer diameter of the joint JT is larger than an outer diameter of a contact portion between the lower pillar LMH and the joint JT, and is larger than a diameter of a contact portion between the upper pillar UMH and the joint JT. An interval of a joint layer in the Z-direction, in which the joint JT is provided (an interval between the conductive layers 34 and 35), is wider than an interval between neighboring conductive layers 33, and is wider than an interval between the neighboring conductive layers 36.

The memory pillar MH includes, for example, a block insulation film 40, a charge storage film (also referred to as a charge storage layer) 41, a tunnel insulation film 42, and a semiconductor layer 43. Specifically, the block insulation film 40 is provided on an inner wall of a memory hole for forming the memory pillar MH. The charge storage film 41 is provided on an inner wall of the block insulation film 40. The tunnel insulation film 42 is provided on an inner wall of the charge storage film 41. Furthermore, the semiconductor layer 43 is provided on an inner side of the tunnel insulation film 42. The memory pillar MH may have a structure in which a core insulation layer is provided inside the semiconductor layer 43.

In the configuration of such memory pillar MH, a portion at which the memory pillar MH and the conductive layer 32 intersect functions as the select gate transistor ST2. Each of the portions at which the memory pillar MH and the conductive layers 33 intersect functions as the memory cell transistors MT0 to MT47. Each of the memory cell transistors MT0 to MT47 is a memory cell on which data is stored, or is storable. Each of the portions at which the memory pillar MH and the conductive layers 34 and 35 intersect functions as the dummy transistors DLT and DUT. Each of the dummy transistors DLT and DUT is a memory cell on which data is not stored. Each of the portions at which the memory pillar MH and the conductive layers 36 intersect functions as the memory cell transistors MT48 to MT95. Each of the memory cell transistors MT48 to MT95 is a memory cell on which data is stored, or is storable. Furthermore, a portion at which the memory pillar MH and the conductive layer 37 intersect functions as the select gate transistor ST1.

The semiconductor layer 43 functions as a channel layer of the memory cell transistors MT, the dummy transistors DLT and DUT, and the select gate transistors ST1 and ST2. A current path of the NAND string NS is formed inside the semiconductor layer 43.

The charge storage film 41 has a function of accumulating an electric charge injected from the semiconductor layer 43 in the memory cell transistor MT. The charge storage film 41 includes, for example, a silicon nitride film.

The tunnel insulation film 42 functions as a potential barrier when an electric charge is injected into the charge storage film 41 from the semiconductor layer 43, or when an electric charge accumulated in the charge storage film 41 is diffused to the semiconductor layer 43. The tunnel insulation film 42 includes, for example, a silicon oxide film.

The block insulation film 40 prevents the electric charge accumulated in the charge storage film 41 from being diffused to the conductive layers (word lines WL) 33 to 36. The block insulation film 40 includes, for example, a silicon oxide film and a silicon nitride film.

A conductive layer 38 is provided above the upper surface of the memory pillar MH via an interlayer insulation film. The conductive layer 38 is formed extending linearly in the X-direction, and functions as the bit line (or a wiring layer) BL. A plurality of conductive layers 38 are arranged in the Y-direction (not shown), and the conductive layer 38 is electrically connected to one memory pillar MH corresponding to each string unit SU. Specifically, in each string unit SU, the contact plug BLC is provided on the semiconductor layer 43 inside each memory pillar MH, and one conductive layer 38 is provided on the contact plug BLC. The contact plug BLC includes a conductive layer.

The configuration of the memory cell array 11 is not limited to the configuration explained above. For example, the number of string units SU included in each block BLK can be set as appropriate. Furthermore, the number of each of the memory cell transistors MT, the dummy transistors DLT and DUT, and the select gate transistors ST1 and ST2 included in each NAND string NS can also be set as appropriate.

Furthermore, the number of each of the word lines WL, the dummy word lines WLDL and WLDU, and the select gate lines SGD and SGS is changed in accordance with the number of memory cell transistors MT, dummy transistors DLT and DUT, and select gate transistors ST1 and ST2. The select gate line SGS may be configured by a plurality of conductive layers provided respectively on a plurality of layers. The select gate line SGD may be configured by a plurality of conductive layers provided respectively on a plurality of layers.

The configurations of other memory cell arrays 11 are described, for example, in U.S. patent application Ser. No. 12/407,403 entitled "THREE DIMENSIONAL STACKED NONVOLATILE SEMICONDUCTOR MEMORY" filed on Mar. 19, 2009. The configuration of the memory cell array 11 is also described in U.S. patent application Ser. No. 12/406,524 entitled "THREE DIMENSIONAL STACKED NONVOLATILE SEMICONDUCTOR MEMORY" filed on Mar. 18, 2009, U.S. patent application Ser. No. 12/679,991 entitled "NON-VOLATILE SEMICONDUCTOR STORAGE DEVICE AND METHOD OF MANUFACTURING THE SAME" filed on Mar. 25, 2010, and U.S. patent application Ser. No. 12/532,030 entitled "SEMICONDUCTOR MEMORY AND METHOD FOR MANUFACTURING THE SAME" filed on Mar. 23, 2009. The entire contents of these patent applications are incorporated herein by reference.

1.1.3. Threshold Voltage Distribution of Memory Cell Transistor

Figure 4:
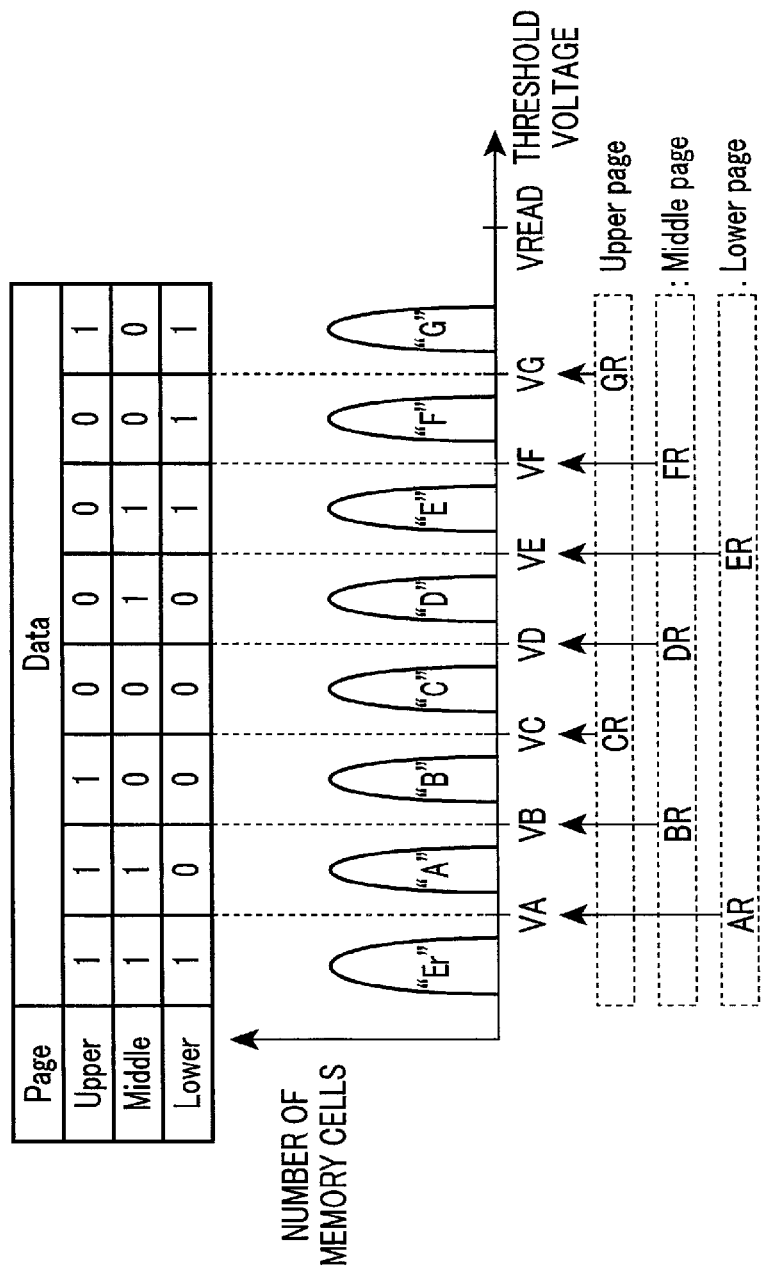
FIG. 4 shows data that can be taken by the memory cell transistor and a threshold voltage distribution thereof according to the embodiment.

Data that may be taken by the memory cell transistor MT and a threshold voltage distribution thereof will be explained with reference to FIG. 4. FIG. 4 shows data that may be taken by the memory cell transistor MT and a threshold voltage distribution thereof according to the embodiment. Here, as a storage system of the memory cell transistor MT, a case of applying a Triple-Level Cell (TLC) system that is capable of storing three-bit data in one memory cell transistor MT will be explained. The present embodiment may also be applied in the case of using other storage systems, such as a Multi-Level Cell (MLC) system that is capable of storing two-bit data in one memory cell transistor MT, and a Quad-Level Cell (QLC) system that is capable of storing four-bit data in one memory cell transistor MT.

As shown in FIG. 4, a plurality of memory cell transistors MT to which the TLC system is applied form eight threshold voltage distributions. Each of the memory cell transistors MT is able to hold, for example, three-bit data in accordance with their threshold voltage distributions. The three-bit data is, for example, "111", "110", "100", "000", "010", "011", "001", and "101" in the order from the lowest threshold voltage. The states of the threshold voltage of the memory cell transistors holding the above data is, for example, in the order from the lowest, an "Er" state (for example, lower than voltage VA), an "A" state (for example, not lower than voltage VA, and not higher than voltage VB, VA<VB), a "B" state (for example, not lower than voltage VB, and not higher than voltage VC, VB<VC), a "C" state (for example, not lower than voltage VC, and not higher than voltage VD, VC<VD), a "D" state (for example, not lower than voltage VD, and not higher than voltage VE, VD<VE), an "E" state (for example, not lower than voltage VE, and not higher than voltage VF, VE<VF), an "F" state (for example, not lower than voltage VF, and not higher than voltage VG, VF<VG), or a "G" state (for example, not lower than voltage VG). The relationship between the three-bit data and the threshold voltages are not limited to the above, and may be selected as appropriate.

The three-bit data held by each of the memory cell transistors MT will be referred to respectively as a lower bit, a middle bit, and an upper bit from the lower bit side. A group of lower bits, a group of middle bits, a group of upper bits held by the cell unit CU including a plurality of memory cell transistors connected to the same word line will be referred to respectively as a lower page, a middle page, and an upper page in the same string unit. In other words, three pages are allocated to the cell unit CU. Data is written and read in units of pages or units of cell units.

1.2. Configuration of Row Decoder

Figure 5:
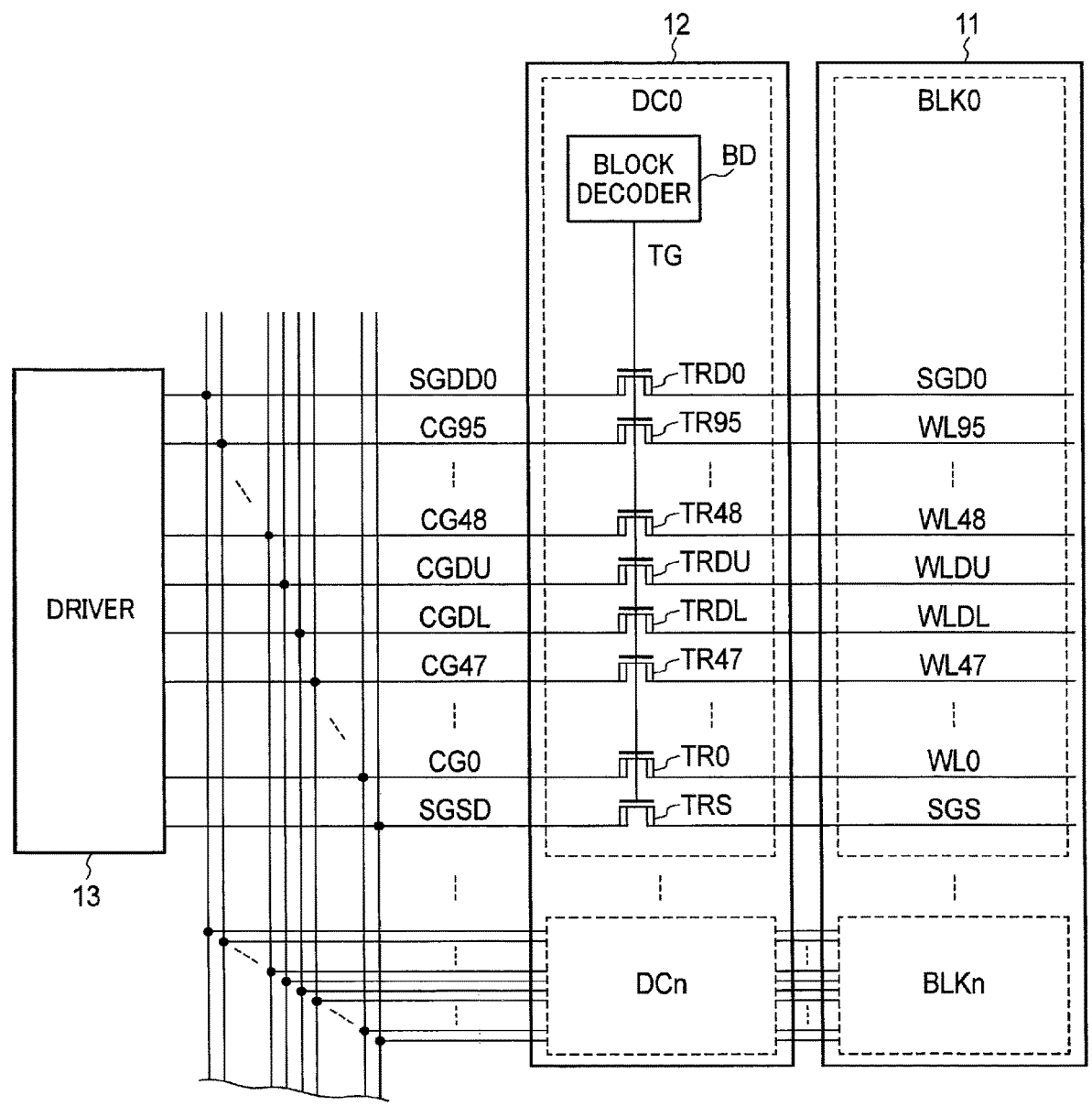
FIG. 5 is a circuit diagram showing a configuration of a row decoder according to the embodiment.

A configuration of the row decoder 12 of the present embodiment will be explained with reference to FIG. 5. FIG. 5 is a circuit diagram showing a configuration of a row decoder according to the embodiment.

The row decoder 12 includes decoders DC0 to DCn. Hereinafter, the description "decoder DC" will indicate each of the decoders DC0 to DCn. The decoders DC0 to DCn correspond respectively to blocks BLK0 to BLKn. In other words, one decoder DC is associated with one block BLK. In the following, an example of the decoder DC0 corresponding to the block BLK0 will be given to explain the circuit configuration of the decoder DC0.

The decoder DC includes a block decoder BD and transfer transistors TRS, TR0 to TR47, TRDL, TRDU, TR48 to TR95, and TRD0. The block decoder BD decodes a block address and applies a predetermined voltage to a transfer gate line TG based on the decode result. The transfer gate line TG is commonly connected to each gate of the transfer transistors. The transfer transistor includes, for example, a high-voltage n-channel MOS transistor.

Each of the transfer transistors is connected between a signal line to which a voltage is supplied from the driver 13 and a wiring provided on the blocks BLK0. Specifically, the drain of the transfer transistor TRS is connected to a signal line SGSD, and the source of the transfer transistor TRS is connected to the select gate line SGS of the block BLK0. Each drain of the transfer transistors TR0 to TR95 is connected respectively to signal lines CG0 to CG95, and each source of the transfer transistors TR0 to TR95 is connected respectively to one end of the word lines WL0 to WL95 of the block BLK0. The drain of the transfer transistor TRDL is connected to a signal line CGDL, and the source of the transfer transistor TRDL is connected to the dummy word line WLDL. The drain of the transfer transistor TRDU is connected to a signal line CGDU, and the source of the transfer transistor TRDU is connected to the dummy word line WLDU. Furthermore, the drain of the transfer transistor TRD0 is connected to a signal line SGDD0, and the source of the transfer transistor TRD0 is connected to the select gate line SGD0 of the block BLK0.

The row decoder 12 having the above configuration selects a block BLK of various types of operation targets, and applies a voltage supplied from the driver 13 to the selected block BLK. Specifically, when various types of operations are performed, the block decoders BD corresponding to selected and unselected blocks BLK respectively apply "H" level and "L" level voltages to the transfer gate line TG.

For example, in the case where the block BLK0 is selected, the transfer transistors TRS to TRD0 in the decoder DC0 are turned ON, and the transfer transistors TRS to TRD0 in the other decoders DC are turned OFF. Therefore, a current path is formed between each wiring provided in the block BLK0 and the corresponding signal line, and a current path is blocked between each wiring provided in the other blocks BLK and the corresponding signal line. As a result, the voltage supplied respectively to each of the signal lines by the driver 13 is applied respectively to each wiring in the selected block BLK0 via the decoder DC0.

2. Write Operation of Semiconductor Memory Device

A write operation in the semiconductor memory device of the present embodiment will be explained. In the write operation, a write loop including a program operation (also referred to as program) and a program verify operation is repeatedly executed until a threshold voltage of the memory cell transistor MT rises to a predetermined voltage.

The program operation is an operation that applies a write voltage (also referred to as a program voltage) to the gate of the memory cell transistor MT to inject an electric charge into the charge storage layer of the memory cell transistor, to rise the threshold voltage of the memory cell transistor. The program verify operation is an operation that confirms changes in the threshold voltage of the memory cell transistor MT caused by the application of the write voltage. The program verify operation determines whether or not the threshold voltage of the memory cell transistor has reached a predetermined voltage. Here, the program operation according to the present embodiment will be explained, and the explanation of the program verify operation will be omitted.

The program operation in the write operation of the present embodiment is applicable to various write systems. For example, as a write system, there is a system in which data of a plurality of bits is collectively written on the memory cell transistor MT by one program command (for example, a full-sequence program), and a system in which data of a plurality of bits is written on the memory cell transistor MT in multiple stages by a plurality of program commands (for example, a two-stage program or foggy-fine).

In the two-stage program, a lower page, such as lower, is written in a write operation of a first stage, and an upper page, such as upper and middle, is simultaneously written in a write operation of a second stage. In the foggy-fine, all of the pages, such as lower/upper/middle, are roughly written in a write operation of a first stage, and the pages written in the write operation of the first stage are written in detail in a write operation of a second stage. The program operation of the present embodiment can be used in both systems.

In the following, the program operation in the write operation of the present embodiment will be explained.

As shown in FIG. 3, the NAND-type flash memory 10 of the present embodiment has the joint JT between the lower pillar LMH and the upper pillar UMH. In a structure that has the joint JT between the lower pillar LMH and the upper pillar UMH, in some cases, upon a write operation, a malfunction (for example, erroneous writing) such a rise in the threshold voltage may occur in a non-writing-target (or write-inhibited) memory cell transistor MT connected to a word line near the joint JT. The present embodiment deals with such malfunction that occurs in the memory cell transistor MT near the joint JT. Therefore, here, in the program operation, a voltage to be applied to the word lines WL48 to WL51 and the dummy word line WLDU will be focused on and explained. Details on the malfunction that occurs in the above-mentioned memory cell transistor MT will be explained later on.

The write operation is executed in units of a word line WL. The write operation for the word lines WL0 to WL95 is executed in the order of, for example, a plurality of memory cell transistors MT connected to the word line WL0, then the memory cell transistor connected to respective word lines from the word lines WL1 and WL2, and, sequentially, up to the word line WL95.

2.1. First Example of Write Operation

FIG. 6 is a timing chart of a program operation in a first example of the write operation, and shows voltages applied to the select gate lines, the word lines, and the bit lines. The first example presents the write operation sequentially performed on the first word line WL48 that is the nearest to the joint JT, and the second word line WL49 that is the second nearest to the joint JT, excluding the dummy word line, then performing the write operation on the third word line WL50.

As shown in FIG. 6, the program operation includes a pre-charge period, a program/boost period, and a discharge period. The pre-charge period is a period in which, prior to the program period, a non-selected bit line BL is charged to a voltage VDDSA that is higher than a ground voltage (for example, 0V). Hereinafter, an operation of charging the bit line BL to the voltage VDDSA will be referred to as a pre-charge operation. The program/boost period is a period in which a write voltage is applied to a selected word line WL, and an electric charge is injected into a charge storage layer of a write-target memory cell transistor MT, as well as a period in which a channel potential of a NAND string NS connected to an unselected bit line BL rises to prevent an electric charge from being injected into a charge storage layer of a non-writing-target memory cell transistor MT. The discharge period is a period in which a voltage applied to each of the word lines WL, the dummy word lines WLDU and WLDL, each of the bit lines BL, and each of the select gate lines SGD is discharged to a ground voltage.

As shown in FIG. 6, prior to starting the pre-charge period, the voltage of each of the select gate lines SGD, each of the word lines WL, the dummy word lines WLDU and WLDL, and each of the bit lines BL is set to a voltage VSS. The voltage VSS is a ground voltage in the NAND-type flash memory 10 serving as the semiconductor memory device.

Operation during the pre-charge period is executed in the following manner. At time t0, the row decoder 12 applies a voltage VGP to the dummy word line WLDU. The voltage VGP is set to a voltage that turns ON a dummy transistor connected to the dummy word line WLDU.

Subsequently, prior to time t1, the sense amplifier 14 applies a voltage VDDSA to the non-selected (or write-inhibited) bit line BL. The voltage VDDSA is a voltage that turns ON the select gate transistor when a voltage VSGDH is applied to a selected select gate line SGD, and that turns OFF the select gate transistor when a voltage VSGD is applied to the selected select gate line SGD.

At time t1, the row decoder 12 applies the voltage VSGDH to the selected select gate line and the unselected select gate line SGD. The voltage VSGDH is a voltage that turns ON the select gate transistor ST1 regardless of the voltage of the bit line BL. The row decoder 12 applies a voltage VGP to the dummy word line WLDU, applies a voltage VCP2 to unselected word lines WL48 and WL49, applies a voltage VCP1 to a selected word line WL50, and applies a voltage VCP to an unselected word line WL51. As the voltage VCP, a constant voltage may be applied to the word lines WL51 to WL95. Alternatively, as the voltage VCP, a voltage that is gradually reduced from the word lines WL51 to WL95 may also be applied, or a voltage that is gradually reduced from the word line WL51 to a word line halfway among the word lines from WL51 to W95 may be applied, with a constant voltage applied to subsequent word lines. The voltage VCP1 is higher than the voltage VCP, and the voltage VCP2 is higher than the voltage VCP1. In other words, the voltage VCP2 is the highest, and the voltages are lower in the order of the voltage VCP1 and the voltage VCP. The voltage VCP is set to, for example, the lowest voltage at which an unwritten memory cell transistor can be turned ON. The voltage VCP2 is set to, for example, a threshold voltage of the highest state held by the memory cell transistor MT, which, herein, is set in accordance with the threshold voltage of a G state. In other words, the voltage VCP2 is set to a voltage that turns ON the memory cell transistor in the G state. The sense amplifier 14 maintains applying the voltage VDDSA to the unselected bit line BL.

Furthermore, the sense amplifier 14 maintains the voltage of the selected bit line BL as the voltage VSS.

In the pre-charge period in which the above-mentioned voltages are applied, electrons trapped in the joint JT pass through a channel of the NAND string NS connected to the unselected bit line BL, that is, pass through channels of the dummy transistor of the dummy word line WLDU and the memory cell transistors of the word lines WL48 to 51, and move to the sense amplifier 14 side via the select gate transistor ST1. This allows to reduce the occurrence of a phenomenon in which the electrons trapped in the joint JT are injected into the charge storage layer of the non-writing-target memory cell transistor MT during the program/boost period after the pre-charge period.

Subsequently, at time t2, the row decoder 12 discharges the voltage of each of the select gate lines SGD and each of the word lines WL, excluding the dummy word line, and sets the voltage of each of the select gate lines SGD and each of the word lines WL, excluding the dummy word line, to the voltage VSS. The sense amplifier 14 maintains applying the voltage VDDSA to the unselected bit line BL. Furthermore, the sense amplifier 14 maintains the voltage of the selected bit line BL as the voltage VSS.

During the program/boost period, operation is executed in the following manner. At time t3, the row decoder 12 applies the voltage VSGD to the selected select gate line SGD, and maintains the voltage of the unselected select gate line SGD as the voltage VSS. The voltage VSGD is higher than the voltage VSS, and is lower than the voltage VSGDH. The row decoder 12 applies a voltage VPASS to the dummy word line WLDU and each of the word lines WL. The voltage VPASS is a voltage that turns ON the memory cell transistor MT regardless of data held by the memory cell transistor MT, and increases a channel potential by coupling to suppress injection of electrons into the charge storage layer. The sense amplifier 14 maintains applying the voltage VDDSA to the unselected bit line BL. Furthermore, the sense amplifier 14 maintains the voltage of the selected bit line BL as the voltage VSS.

At time t4, the row decoder 12 applies a write voltage VPGM to the selected word line WL50. The voltages of each of the other unselected word lines WL, the dummy word lines WLDU and WLDL, each of the select gate lines SGD, and each of the bit lines BL are maintained as those applied at time t3. The write voltage VPGM is a voltage for injecting electrons into the charge storage layer of the write-target memory cell transistor MT. The write voltage VPGM is higher than the voltage VPASS.

In the program/boost period, electrons are injected into the charge storage layer of the write-target memory cell transistor MT connected to the selected word line WL50, to perform writing. Furthermore, at the non-writing-target memory cell transistor MT connected to the selected word line WL50, the channel potential thereof is boosted, that is, the channel potential is increased, and the electric charge is not injected into the charge storage layer.

Operation during the discharge period is executed in the following manner. At time t5, the row decoder 12 discharges the voltage of the selected word line WL50, and sets the voltage of the word line WL50 to the voltage VPASS. The voltages of each of the other unselected word lines WL, the dummy word lines WLDU and WLDL, each of the select gate lines SGD, and each of the bit lines BL are maintained as those applied at times t3 and t4.

At time t6, the row decoder 12 discharges the voltages of each of the word lines WL and the dummy word lines WLDU and WLDL, and sets the voltages of each of the word lines WL and the dummy word lines WLDU and WLDL to the voltage VSS. The sense amplifier 14 discharges the voltage of the unselected bit line BL, and sets the voltage of the unselected bit line BL to the voltage VSS. Voltages of each of the select gate lines SGD and the selected bit line BL are maintained as the voltage applied at times t3, t4, and t5.

Subsequently, at time t7, the row decoder 12 discharges the voltage of the selected select gate line SGD, and sets the voltage of the selected select gate line SGD to the voltage VSS. Subsequently, at time t8, the discharge of the selected select gate line SGD is ended, and the voltages of each of the select gate lines SGD, each of the word lines WL, the dummy word lines WLDU and WLDL, and each of the bit lines BL are set to the voltage VSS.

In the above manner, the program operation in the first example of the write operation of the embodiment is ended.

2.2. Second Example of Write Operation

The first example mentioned above explains the case in which the write operation is performed on the first word line WL48 from the joint JT side, and the second word line WL49 from the joint JT side, excluding the dummy word line, and then performing the write operation on the third word line WL50; however, in some cases, the malfunction mentioned above may even occur in the case of performing the write operation on the second word line WL49. In the second example, a case of performing a write operation on the second word line WL49 from the joint JT side will be explained.

Figure 7:
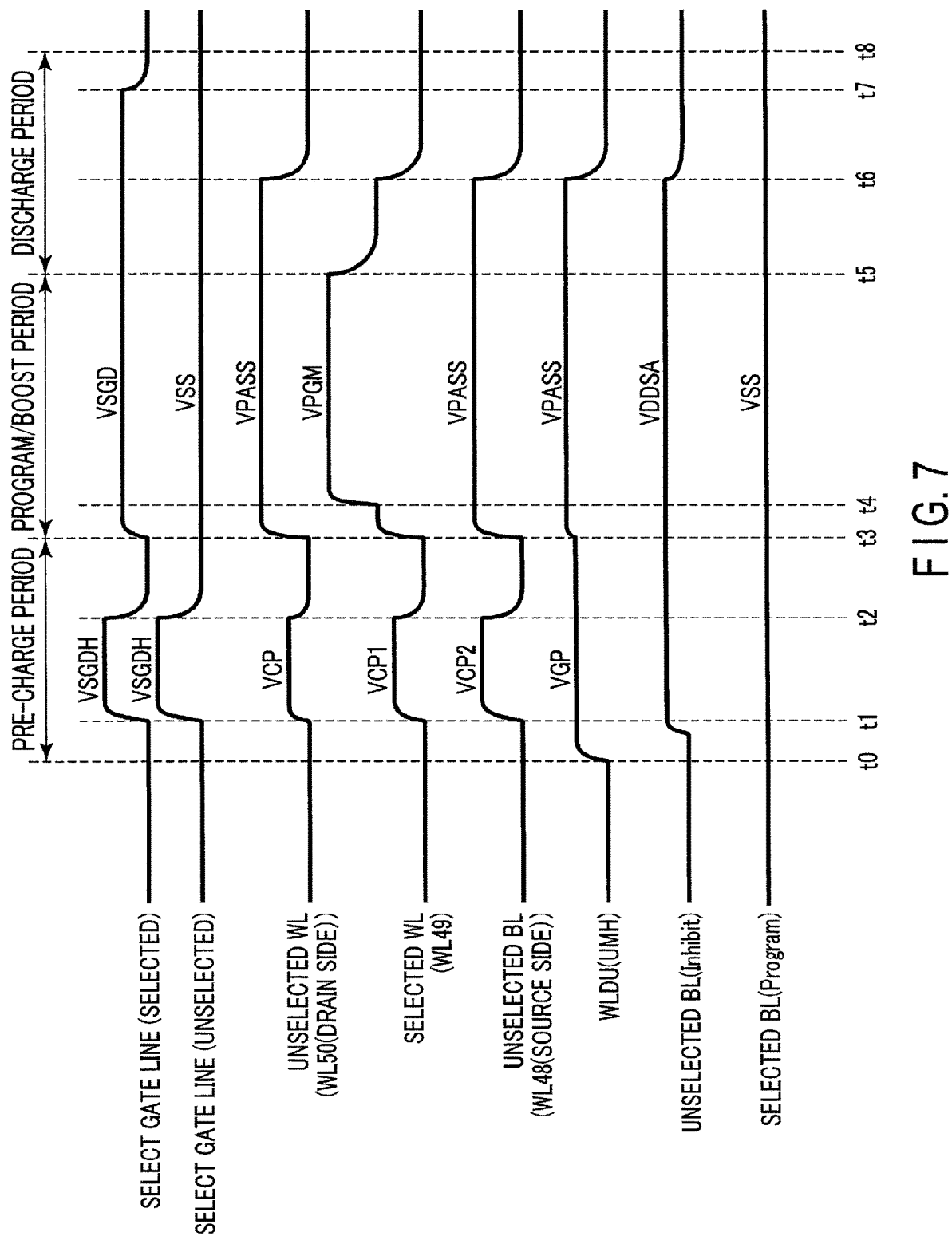
FIG. 7 is a timing chart of a program operation in a second example of a write operation of the embodiment.

FIG. 7 is a timing chart of a program operation in the second example of the write operation, and shows voltages applied to the select gate lines, the word lines, and the bit lines. In the second example shown in FIG. 7, the selected word line WL50, the unselected word lines WL48 and WL49, and the unselected word line WL51 shown in FIG. 6 are respectively replaced by the word line WL49, the word line WL48, and the word line WL50. Voltages of each of the other select gate lines SGD, each of the word lines WL, the dummy word lines WLDU and WLDL, and each of the bit lines BL are the same as those shown in FIG. 6.

Also in a pre-charge period of the second example, electrons trapped in the joint JT pass through a channel of the NAND string NS connected to the unselected bit line BL, that is, pass through channels of the dummy transistor of the dummy word line WLDU and the memory cell transistors MT of the word lines WL48 to 51, and move to the sense amplifier 14 side via the select gate transistor ST1. This allows to reduce the occurrence of a phenomenon in which the electrons trapped in the joint JT are injected into the charge storage layer of the non-writing-target memory cell transistor MT during the program/boost period after the pre-charge period.

3. Advantageous Effects of Embodiment

According to the embodiment, a semiconductor memory device that is capable of improving reliability of the write operation can be provided.

Figure 8:
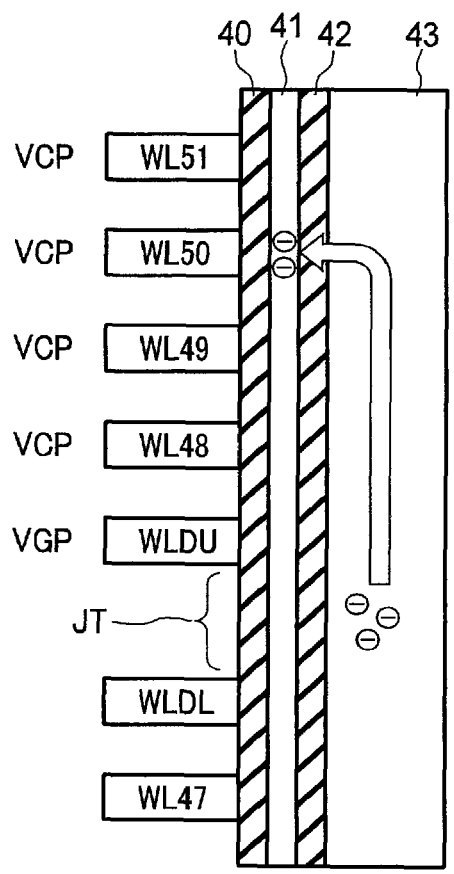
FIG. 8 is a schematic diagram showing behavior of electrons trapped in a joint as a comparative example.

In the following, prior to explaining the details of the advantageous effects of the embodiment, malfunctions (for example, erroneous writing) that may occur in the case where the joint JT is arranged between the lower pillar LMH and the upper pillar UMH will be explained with reference to FIG. 3 and FIG. 8. FIG. 8 is a diagram explaining the cause of a threshold voltage increase that occurs at memory transistors MT near the joint JT, and is a schematic diagram showing the behavior of electrons trapped in the joint JT.

As shown in FIG. 3, the memory pillar MH that the NAND type flash memory 10 includes the joint JT between the lower pillar LMH and the upper pillar UMH. The joint JT is damaged when processing memory holes, etc. upon production. Since this causes a defect in the joint JT, electrons tend to be easily trapped. As shown in FIG. 8, during the program operation, the electrons trapped in the joint JT are drawn in by the write voltage VPGM that is applied to the selected word line WL, pass through channels of the dummy transistor of the dummy word line WLDU and the memory cell transistor MT of the unselected word line WL, and are injected into the charge storage layer of the non-writing-target memory cell transistor connected to the selected word line WL. This causes the threshold voltage of the non-writing-target memory cell transistor to increase, which may cause erroneous writing.

The semiconductor memory device of the embodiment includes a first word line (for example, the word line WL49) arranged above the semiconductor substrate 30, a second word line (for example, the word line WL50) that is stacked on the first word line via an insulation layer, the memory pillar MH, the bit lines electrically connected to the memory pillar MH, and the driver 13 that applies a voltage to the first and the second word lines. The memory pillar MH passes through the first and the second word lines, and includes the lower pillar LMH on the semiconductor substrate 30, the upper pillar UMH on the lower pillar LMH, and the joint JT between the lower pillar LMH and the upper pillar UMH. In a pre-charge operation that boosts the bit lines BL during a write operation in which the second word line is selected, the driver 13 applies the voltage VCP1 to the second word line, and applies the voltage VCP2 that is higher than the voltage VCP1 to the first word line.

In the embodiment including the above configuration, as shown in FIG. 9, in the pre-charge operation in the write operation, the electrons trapped in the semiconductor layer of the joint JT move to the select gate transistor ST1 side. Therefore, in a period where the write voltage VPGM is applied to the selected word line WL, the occurrence of the phenomenon shown in FIG. 8, in which the electrons trapped in the joint JT are injected into the charge storage layer of the non-writing-target memory cell transistor, can be reduced. This allows to reduce the malfunction in which the threshold voltage of the non-writing-target memory cell transistor increases and causes erroneous writing. As a result, the present embodiment is able to improve the reliability of the write operation.

4. Other Modified Examples, Etc.

In this specification, the term "connection" indicates an electrical connection, and includes a state in which, for example, the connection is made through another element. Furthermore, in this specification, the term "turn OFF" indicates applying to a gate of a corresponding transistor a voltage that is lower than a threshold voltage of the transistor, and includes a state in which, for example, a small amount of current such as a leak current of the transistor flows.

The above embodiment is as follows.

(1) In the read operation, a voltage to be applied to a word line selected for an "A" level read operation is, for example, between 0 and 0.55V. The voltage is not limited to this, and may be between one of 0.1 to 0.24V, 0.21 to 0.31V, 0.31 to 0.4V, 0.4 to 0.5V, or 0.5 to 0.55V.

A voltage to be applied to a word line selected for a "B" level read operation is, for example, between 1.5 and 2.3V. The voltage is not limited to this, and may be between one of 1.65 to 1.8V, 1.8 to 1.95V, 1.95 to 2.1V, or 2.1 to 2.3V.

A voltage to be applied to a word line selected for a "C" level read operation is, for example, between 3.0 to 4.0V. The voltage is not limited to this, and may be between one of 3.0 to 3.2V, 3.2 to 3.4V, 3.4 to 3.5V, 3.5 to 3.6V, or 3.6 to 4.0V.

The read operation time (tRead) may be, for example, between 25 and 38 μs, 38 and 70 μs, and 70 and 80 μs.

(2) The write operation includes a program operation and a verify operation, as described above. A voltage first applied to a word line selected during the program operation is, for example, between 13.7 and 14.3V. The voltage is not limited to this, and may be between one of 13.7 to 14.0V, and 14.0 to 14.6V. A voltage to be applied to the unselected word line during the program operation may be, for example, between 6.0 and 7.3V. The voltage is not limited to this case, and may be, for example, between 7.3 and 8.4V, or 6.0V or lower.

In the write operation, a voltage to be first applied to the selected word line may differ between when an odd-numbered word line is selected and when an even-numbered word line is selected. In the write operation, a pass voltage to be applied may be changed depending on whether the unselected word line is an odd-numbered word line or an even-numbered word line.

In the case where the program operation is an Incremental Step Pulse Program system (ISPP), a step-up width of a program voltage may be, for example, approximately 0.5V.

The write operation time (tProg) may be, for example, between 1700 and 1800 μs, 1800 and 1900 μs, and 1900 and 2000 μs.

(3) In an erase operation, a voltage to be first applied to a well that is formed on the upper part of the semiconductor substrate, and that above which the aforementioned memory cell is disposed, is, for example, between 12.0 and 13.6V. The voltage is not limited to this case, and may be, for example, between 13.6 to 14.8V, 14.8 to 19.0V, 19.0 to 19.8V, and 19.8 and 21.0V.

The erase operation time (tErase) may be, for example, between 3000 and 4000 μs, 4000 and 5000 μs, and 4000 and 9000 μs.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the invention. The accompanying claims and their equivalents are intended to cover such forms or modifications as would fall within the scope and spirit of the invention.

What is claimed is:

1. A semiconductor memory device comprising:
a first word line provided above a substrate;
a second word line provided above the first word line;
a third word line provided above the second word line;
a first semiconductor layer including a first part that passes through the first word line, and is provided above the substrate, a second part that passes through the second and the third word lines, and is provided above the first part, and a first joint that is provided between the first part and the second part;
a first bit line electrically connected to the first semiconductor layer;
a row decoder that applies a voltage to the first, the second, and the third word lines; and
a select transistor connected between the first bit line and a memory cell transistor, wherein
when a write operation is performed on the memory cell transistor connected to the third word line, prior to applying a write voltage to the third word line, a first voltage is applied to the first bit line, a second voltage is applied to the third word line, and a third voltage that is higher than the second voltage is applied to the second word line,
the select transistor is turned OFF when the first voltage is applied to the first bit line, the write voltage is applied to the third word line, and a fourth voltage is applied to a gate of the select transistor.

2. The semiconductor memory device according to claim 1, wherein
the memory cell transistor connected to the third word line is turned ON when the second voltage is applied to the third word line, and a memory cell transistor connected to the first word line is turned ON when the third voltage is applied to the first word line.

3. The semiconductor memory device according to claim 1, wherein
the write operation includes a pre-charge period, and a program period after the pre-charge period,
in the pre-charge period, the first voltage, the second voltage, and the third voltage are respectively applied to the first bit line, the third word line, and the second word line, and
in the program period, the write voltage is applied to the third word line.

4. The semiconductor memory device according to claim 1, further comprising:
a second semiconductor layer including a third part that passes through the first word line, and is provided above the substrate, a fourth part that passes through the second and the third word lines, and is provided above the third part, and a second joint that is provided between the third part and the fourth part; and
a second bit line electrically connected to the second semiconductor layer, wherein
in the write operation, the first bit line is connected to a non-writing-target memory cell transistor, the second bit line is connected to a write-target memory cell transistor, and a fourth voltage that is lower than the first voltage is applied to the second bit line.

5. The semiconductor memory device according to claim 1, further comprising a fourth word line provided above the third word line, wherein in a pre-charge period, the row decoder applies a fourth voltage that is lower than the second voltage to the fourth word line.

6. The semiconductor memory device according to claim 1, further comprising:
a fourth word line that is provided above the first joint, and is adjacent to the first joint, and
a fifth word line that is provided below the first joint, and is adjacent to the first joint, wherein
the third word line is adjacent to the second word line, and an interval between the fourth word line and the fifth word line is wider than that between the third word line and the second word line.

7. The semiconductor memory device according to claim 1, wherein
in a direction parallel to a surface of the substrate, an outer diameter of the first joint is larger than an outer diameter of a contact portion between the first part and the first joint, and is larger than an outer diameter of a contact portion between the second part and the first joint.

8. A semiconductor memory device comprising:
conductive layers stacked above a substrate via insulation layers;
a first memory pillar including a first column above the substrate, a second column above the first column, and a first joint between the first column and the second column, and that passes through the conductive layers;
a first wiring layer electrically connected to the first memory pillar;
a row decoder that applies a voltage to the conductive layers; and
a sense amplifier that applies a voltage to the first wiring layer, wherein
the conductive layers include a first conductive layer that is above the first joint, and a second conductive layer that is distant from the first joint than the first conductive layer, and is adjacent to the first conductive layer,
in a write operation with respect to the second conductive layer, the write operation includes a pre-charge period, and a program period after the pre-charge period,
in the pre-charge period, the sense amplifier applies a first voltage to the first wiring layer, and the row decoder applies a second voltage to the second conductive layer, and applies a third voltage that is higher than the second voltage to the first conductive layer, and
in the program period, the row decoder applies a write voltage to the second conductive layer.

9. The semiconductor memory device according to claim 8, wherein
intersecting portions of the conductive layers and the first and the second columns function as memory cell transistors, and
a memory cell transistor connected to the second conductive layer is turned ON when the second voltage is applied to the second conductive layer, and a memory cell transistor connected to the first conductive layer is turned ON when the third voltage is applied to the first conductive layer.

10. The semiconductor memory device according to claim 8, further comprising a select transistor connected between the first wiring layer and a memory cell transistor connected to the second conductive layer, wherein
the select transistor is turned OFF when the first voltage is applied to the first wiring layer, the write voltage is applied to the second conductive layer, and a fourth voltage is applied to a gate of the select transistor.

11. The semiconductor memory device according to claim 8, further comprising:
- a second memory pillar including a first column above the substrate, a second column above the first column, and a second joint between the first column and the second column, and that passes through the conductive layers; and
- a second wiring layer electrically connected to the second memory pillar, wherein in the write operation, the first wiring layer is connected to a non-writing-target memory cell transistor, the second wiring layer is connected to a write-target memory cell transistor, and the sense amplifier applies a fourth voltage that is lower than the first voltage to the second wiring layer.

12. The semiconductor memory device according to claim 8, further comprising a third conductive layer that is stacked above the second conductive layer via an insulation layer, wherein
- in the pre-charge period, the row decoder applies a fourth voltage that is lower than the second voltage to the third conductive layer.

13. The semiconductor memory device according to claim 8, further comprising:
- a third conductive layer that is provided above the first joint, and is adjacent to the first joint; and
- a fourth conductive layer that is provided below the first joint, and is adjacent to the first joint, wherein an interval between the third conductive layer and the fourth conductive layer is wider than an interval between the second conductive layer and the first conductive layer.

14. The semiconductor memory device according to claim 8, wherein
- in a direction parallel to a surface of the substrate, an outer diameter of the first joint is larger than an outer diameter of a contact portion between the first column and the first joint, and is larger than an outer diameter of a contact portion between the second column and the first joint.

15. A semiconductor memory device comprising:
- conductive layers stacked above a substrate via insulation layers;
- a memory pillar including a first pillar above the substrate, a second pillar above the first pillar, and a joint between the first pillar and the second pillar, and that passes through the conductive layers;
- a wiring layer electrically connected to the memory pillar;
- a row decoder that applies a voltage to the conductive layers; and
- a sense amplifier that applies a voltage to the wiring layer, wherein
the conductive layers include a first conductive layer that is provided above the joint, a second conductive layer that is more distant from the joint than the first conductive layer, and is adjacent to the first conductive layer, a third conductive layer that is provided above the joint, and is adjacent to the joint, and a fourth conductive layer that is provided below the joint, and is adjacent to the joint, wherein
- an interval between the third conductive layer and the fourth conductive layer is wider than an interval between the second conductive layer and the first conductive layer,
- in a write operation with respect to the second conductive layer, the write operation includes a pre-charge period, and a program period after the pre-charge period,
- in the pre-charge period, the sense amplifier applies a first voltage to the wiring layer, and the row decoder applies a second voltage to the second conductive layer, and applies a third voltage that is higher than the second voltage to the first conductive layer, and
- in the program period, the row decoder applies a write voltage to the second conductive layer.

16. The semiconductor memory device according to claim 15, wherein
- intersecting portions of the conductive layers and the first and the second pillars function as memory cell transistors, and
- a memory cell transistor connected to the second conductive layer is turned ON when the second voltage is applied to the second conductive layer, and a memory cell transistor connected to the first conductive layer is turned ON when the third voltage is applied to the first conductive layer.

17. The semiconductor memory device according to claim 15, further comprising a select transistor connected between the wiring layer and a memory cell transistor connected to the second conductive layer, wherein
- the select transistor is turned OFF when the first voltage is applied to the wiring layer, the write voltage is applied to the second conductive layer, and a fourth voltage is applied to a gate of the select transistor.

18. The semiconductor memory device according to claim 15, further comprising a fifth conductive layer that is stacked above the second conductive layer via an insulation layer, wherein
- in the pre-charge period, the row decoder applies a fourth voltage that is lower than the second voltage to the fifth conductive layer.

19. The semiconductor memory device according to claim 15, wherein
- in a direction parallel to a surface of the substrate, an outer diameter of the joint is larger than an outer diameter of a contact portion between the first pillar and the joint, and is larger than an outer diameter of a contact portion between the second pillar and the joint.

* * * * *